US008264216B2

(12) United States Patent
Marten

(10) Patent No.: US 8,264,216 B2
(45) Date of Patent: Sep. 11, 2012

(54) HIGH-ACCURACY LOW-POWER CURRENT SENSOR WITH LARGE DYNAMIC RANGE

(75) Inventor: Victor Marten, Flushing, NY (US)

(73) Assignee: Sendyne Corp., New York, NY (US)

(*) Notice: Subject to any disclaimer, the term of this patent is extended or adjusted under 35 U.S.C. 154(b) by 0 days.

(21) Appl. No.: 13/003,565

(22) PCT Filed: Dec. 13, 2010

(86) PCT No.: PCT/US2010/060106
§ 371 (c)(1),
(2), (4) Date: Jan. 12, 2011

(87) PCT Pub. No.: WO2012/039735
PCT Pub. Date: Mar. 29, 2012

(65) Prior Publication Data
US 2012/0086430 A1   Apr. 12, 2012

Related U.S. Application Data

(60) Provisional application No. 61/385,102, filed on Sep. 21, 2010.

(51) Int. Cl.
*G01R 27/08* (2006.01)
*H03B 1/00* (2006.01)
(52) U.S. Cl. ........................ 324/76.11; 324/691; 327/112
(58) Field of Classification Search .............. 324/72, 324/76.11, 691–727; 327/112, 170
See application file for complete search history.

(56) References Cited

U.S. PATENT DOCUMENTS

| 5,498,984 | A | | 3/1996 | Schaffer |
| 5,585,994 | A | * | 12/1996 | Tamai et al. ................ 361/98 |
| 5,910,875 | A | * | 6/1999 | Tian et al. ................ 361/78 |
| 6,956,727 | B1 | | 10/2005 | Brokaw |
| 7,973,543 | B2 | * | 7/2011 | Andoh et al. ............ 324/713 |
| 2005/0206367 | A1 | | 9/2005 | Kreiger |
| 2008/0157752 | A1 | | 7/2008 | Lu |

OTHER PUBLICATIONS

International Search Report in PCT/US10/60106 mailed Oct. 21, 2011.
Written Opinion in PCT/US10/60106 mailed Oct. 21, 2011.

* cited by examiner

*Primary Examiner* — Timothy J Dole
*Assistant Examiner* — Farhana Hoque
(74) *Attorney, Agent, or Firm* — Oppedahl Patent Law Firm LLC

(57) ABSTRACT

A current sensing approach makes use of two shunts in series, embedded in a switching fabric, each shunt the object of a differential measurement of voltage drop across the shunt. Methodical make-before-break cycling of the switches in the switching fabric permit real-time or very near-real-time measurement of nearly all of the errors such as offset errors present in each differential-measurement path. Additional differential measurement paths can be connected with the shunts, with RFI filtering at shorter time constants to serve electronic fuse needs.

32 Claims, 4 Drawing Sheets

HIGH-ACCURACY LOW-POWER CURRENT SENSOR WITH LARGE DYNAMIC RANGE

CROSS-REFERENCE TO RELATED APPLICATIONS

This application claims the benefit of U.S. patent application No. 61/385,102 filed Sep. 21, 2010, which application is incorporated herein by reference.

BACKGROUND

It is not easy to measure the flow of electricity accurately over a wide dynamic range while dissipating very little waste heat.

Whenever electrical energy is used, it is desirable to measure the quantity of energy used, both per unit of time (e.g. power), and over a specific amount of time (for example, energy used per month). In a residential environment, an electric power meter is a familiar fixture; it allows the power-providing companies to charge their customers for the energy used.

In the most basic terms, the instantaneous power is a product of the voltage applied to, and the current flowing through, the load. An integration of this product (power) over a specific time interval yields the total consumption of the electrical energy within that time interval.

Accurate measurement of the load current is thus an important part of the apparatus that measure the consumption of electrical energy.

It will be helpful to review the present state of the art in current measurements, considering numerous examples of the devices capable of current measurement. In broad terms, they all fall into two categories, namely:

- direct measurement of the current as manifested by a voltage drop across a sense resistor (oftentimes called a resistive shunt), and
- indirect measurement of the flowing current by assessment of the magnetic field that is created around the conducting wire that is carrying the current.

Current-measuring apparatus further differ in their ability to measure DC (direct current) or AC (Alternating Current), and also differ in the total range of frequencies that can be processed with a high degree of accuracy. The apparatus that can accommodate large currents also differ in their ability to measure small currents accurately.

Typical current sensors in industrial, commercial, and household environments furnish the AC measurements; the parameter of interest is the peak-to-peak or Root-Mean-Square (RMS) value of the current, averaged across at least a single cycle of the AC frequency; in such measurements the DC component of the current is assumed to be exactly zero. The ultimate use of these measurements is for an overall consumption of energy, and the sensor is made to be quite accurate when a large level of current is flowing. Errors resulting from inadequate precision of measurements for small levels of current are simply ignored, as they contribute only minimally to the total energy assessment. Stated differently, when one is measuring large currents to assess overall energy consumptions, one does not mind that small currents are not measured accurately.

A moment's reflection, however, will reveal that for operations with DC power, and specifically for DC-power systems that use a battery, the current measurement needs are quite different. It is not uncommon for a DC-supplied system to spend most of its time operating at a very low power level, and to consumes the full-rated energy only for relatively brief intervals. In such a system, the current-sensing apparatus must be able to faithfully measure the current across widely different levels, while at the same time maintaining a very small DC offset error. In many DC power systems that use a battery, it is desired to monitor the SOC (state of charge) of the battery which requires continuous and uninterrupted current measurements so that integrations may be carried out, making coulometry possible.

Several contradictory constraints apply to such a current sensor, for example:

- The output signal should accurately represent the measured current. In technical terms, the sensitivity or conversion gain between the measured current and output signal should be accurate and stable.
- The readings for times when no current is flowing should be as close as possible to zero. In technical terms, the systematic offset of the measurement should be zero.
- The output signal should be available continuously, with quick response time to the changes in the measured current.
- The current sensor should be insensitive to interfering RF (radio frequency) and EM (electromagnetic) fields, because such fields are naturally present in any environment where electrical energy is used, and are typically generated by the very same apparatus that use the electric energy. This requirement usually dictates the use of so-called RFI (RF interference) filtering, in order to prevent the interfering signals from affecting the measurements.
- The power dissipation in the sensing element should be minimal.
- The energy consumed by the current measurement circuit should be small; this has an increased importance for a system that a operates from a battery, and the actual goal of making the current measurements is for reduction of the energy consumption and/or estimation of the remaining energy in the battery. Having said this, in many applications it is acceptable to permit the energy used in the current measurement circuit to increase somewhat when large currents are flowing, that is, when large amounts of energy are being consumed. In other words, it is desirable to have low energy consumption in relative terms, where the power consumption of the measurement circuit will not appreciably affect the total energy value.

The most common method of the current sensing is to pass the current through a resistor (a current shunt) and to measure the resulting voltage drop, which develops according to Ohm's law. A current sensor circuit based on this principle is illustrated in FIG. 1. Input terminals 1 allow connection of the current shunt 2 into the circuit where current is to be measured. Instrumentation amplifier (IA) 6 senses voltage across the current shunt 2, and provides (voltage) output on terminals 10.

Pick-up points 3 on the current shunt 2 are located following the principle of "Kelvin sensing" that reduces errors associated with resistance of the sense connections and wires. With such an arrangement, the conductors that do the sensing have almost no current, and so there is very little IR (current times resistance) drop in those conductors.

RFI Filter 4 is utilized for reduction of effects due to interfering RF signals from surrounding machinery and environment. This part of the circuit may have various configurations, and may consist of resistive, capacitive, and inductive components, as well as semiconductor transient protectors.

The particular configuration 4 shown in FIG. 1 is exemplary but there are many possible arrangements which might be employed.

FIG. 1 shows an instrumentation amplifier 6 modeled as containing an ideal amplifier 7. The ideal amplifier 7 is imagined to have infinite input impedance, zero output impedance, linear gain, and zero offsets or drift, all across some defined dynamic range of inputs and from DC to at least some frequency defining some frequency response.

Also shown in FIG. 1 are modeled sources of error 5, 8, and 9 that make the performance less than ideal when compared to the requirements above. The modeled voltage sensing error sources 5 appear in series with the proper signal, and introduce unpredictable offset errors at the inputs of the TA 6. These errors can be further modeled as illustrated in FIG. 2.

Turning to FIG. 2, items comprising a string of dissimilar materials 13, 14, 15, 17, 18, and 20 are joined by solder 16. Exemplary items may be a Kelvin connection lead 13 from the current shunt 2, a surface-mount component 15 such as a resistor, an IC (integrated circuit) lead 17, a lead-to-die bonding wire 18, and IC die metallizations 20 at the IC die 19. A printed circuit (PC) board 12 is composed in part of a substrate material such as FR-4. A modeled temperature gradient 21 is shown, with a higher temperature at one end of this string and a lower temperature at the other end of this string. As mentioned below, anisotropies and inhomogeneities of temperature may easily develop to be more complicated than a mere gradient as shown in FIG. 2. As will be discussed below in connection with the invention, approaches discussed below have some prospect of measuring and correcting errors due to temperature variations that are more complicated than mere gradients.

The materials depicted in FIG. 2 make up the connections between the current shunt 2 and the actual input terminals of the IA 6 (which are part of the die metallization 20). Redrawn in a more recognizable form at the lower part of FIG. 2, it will be appreciated that these connections are in fact thermocouples, each capable of producing a voltage when a temperature difference (temperature gradient 21) exists between the extremes of the circuit at points 13 and 20, or inside of the string of the serially connected elements. This error voltage could potentially be on the order of several millivolts (mV). The most common temperature-induced errors may be because of gradients between 13 and 20, but as will be appreciated, any anisotropies or inhomogeneities in temperature can likewise give rise to error voltages.

Returning to FIG. 1, the error source 8 is a modeled offset error in the IA 6, and the error source 9 is a modeled noise error in the IA 6.

As will be appreciated, the circuit is designed utilizing differential signals, and the designer will hope that this will compensate most of the thermocouple-induced errors, because such errors are to some extent common-mode in nature (affecting each line of the two differentials in somewhat the same way). But any non-identical temperature distributions as between the two paths can give rise to errors which are not automatically compensated by the use of differential sensing.

Because there are error sources 5 in the differential sensing lines, the designer of a system such as is depicted in FIG. 1 will often not go to the trouble to select a module or integrated circuit for IA 6 that has a particularly low offset voltage 8.

The circuits similar to FIG. 1, or derivatives thereof, are generally used for measuring currents up to perhaps 10 A (Amperes). The designer of the current sensing system will typically select a shunt value such that the voltage drop across the sensing resistor 2 is 100 mV or more, so that this voltage will swamp or overwhelm the error sources just described. For any given maximum rated current (that is, for some particular real-life application) the resistance of the shunt 2 will be chosen so that the voltage developed across it is within some range of voltages. This leads to a situation where the heat dissipated in the sense resistor 2 grows at least linearly with the rated maximum current for which the particular circuit is being designed.

The physical size of the sense resistor 2 can thus get to be a problem, as can be the need to providing adequate cooling of the sense resistor. For this reason, for higher currents a different class of current sensing devices is used, typically utilizing an indirect method of current sensing by assessment of the magnetic field that is created around the conducting wire which is carrying the current.

The so-called Hall-effect apparatus are common for current measurements in excess of several Amperes. A Hall-effect device is able to produce a (differential) voltage signal when a continuous (supply) current is sent through the device, and a magnetic field is present that is perpendicular to the flow of that supply current. The voltage signal in the Hall-effect device is linearly proportional to both the supply current and the magnetic field, within limitations of power dissipation resulting from the supply current, and some additional anomalous effects. The current that needs to be measured generates the magnetic field acting on the device.

The sensitivity of the Hall-effect device to the magnetic field depends, among many things, for example upon mechanical dimensions of the sensing element, material composition and uniformity, attachment of the electrodes, stability and accuracy of the supply current, and construction of the magnetic core that concentrates the desired magnetic field and rejects interfering magnetic fields (of which the Earth's magnetic field is just a single example).

Typically every single manufactured Hall-effect device would need an individual calibration in order to ascertain the actual device sensitivity (which further depends on the particular circuit arrangement and on the design of the magnetic path elements).

The native offset of the unaided Hall-effect device is non-zero. For this reason various auto-zeroing schemes have been utilized in the prior art. One approach is to arrange for the supply current to the sensing element to be AC rather than DC. Within such an approach, differing schemes make use of various shapes or waveforms of the AC current, for example sine waves or square waves or even more complex shapes. The AC signal that is the output of the Hall-effect sensing element is further processed by a synchronous detector.

In a system where the Hall-effect sensor is employed and where the current sensed is AC, it usually turns out to be necessary to average or filter the sensed signal over several cycles of the AC excitation. This means that there is always some latency between a current event of interest and the detection of such an event after the averaging or filtering has taken place. The latency cannot be reduced to zero.

A further potential difficulty with such magnetically coupled measurements (particularly where a DC current is converted to AC for purposes of Hall-effect sensing) is that during the zero crossings of the excitation voltage (that is, near the zero values for the sine-wave excitation), the Hall-effect device is altogether insensitive to the magnetic field, and simply discards any information for the duration of the zero-crossing transitions.

Yet another variation of the Hall-effect devices makes use of an active feedback loop that tries to zero-out the total magnetic field acting on the sensing element, thus reducing possible non-linearities in the sensing element (since in this case, the Hall-effect sensing element only needs to indicate if the magnetic field is smaller or higher than zero, and does not need to supply the actual value). A winding on the magnetic path elements creates a magnetic field that is opposite to the field from the measured current. The opposing winding is normally constructed with many turns (typically, with several thousands of turns), so as to minimize the current that needs to be injected into the winding in order to zero out the total magnetic field. The servo loop that drives the zeroing-out winding will of course take some nonzero time to settle and to respond to perturbations.

It will be appreciated that in addition to slow time response, the Hall-effect devices utilizing the active feedback will require additional operating energy in order to supply the feedback circuitry and winding.

These factors make the Hall effect sensing less than ideal, particularly for a battery-powered system.

Other current measurement approaches have been devised that indirectly sense current by assessment of the magnetic field that is created around the conducting wire that is carrying the current. These are based on a so-called magnetoresistance (MR) effect, including variations called Giant Magnetoresistance (GMR) and Colossal Magnetoresistance (CMR). These devices rely on resistance changes within the sensing material due to the magnetic field to which the sensing material is subjected.

The error sources mentioned above with respect to shunt-type current measurements present themselves, mutatis mutandis, with the Hall-effect sensing approaches just discussed, and also present themselves with the apparatus based on the MR-effect. For the MR-effect approaches, the notably worst performance is in respect to the zero-current offset for the MR-effect based measurements.

It would be very desirable if approaches could be found for current measurement, particularly DC measurement, which would be accurate at low currents as well as high currents, and which would be continuously available. It would be desirable if most offset error sources could be zeroed out, leading to measurements accurate enough for coulometry. It would be desirable if the approaches could dissipate very little waste heat in the sensing apparatus, and if the measurements could simultaneously:

be low enough in latency to permit a quick-response electronic "fuse" capability, and yet be sufficiently filtered against RFI so as to permit filtering out such interference.

It would further be desirable if some or all of these results could be achieved economically, without the need for unnecessarily expensive parts such as unnecessarily expensive semiconductor switches and the like.

SUMMARY OF THE INVENTION

A current sensing approach makes use of two shunts in series, embedded in a switching fabric, each shunt the object of a differential measurement of voltage drop across the shunt. Methodical make-before-break cycling of the switches in the switching fabric permit real-time or very near-real-time measurement of nearly all of the errors such as offset errors present in each differential-measurement path. Additional differential measurement paths can be connected with the shunts, with RFI filtering at shorter time constants to serve electronic fuse needs.

DESCRIPTION OF THE DRAWING

The invention will be described with respect to a drawing in several figures, of which.

Where possible, like reference characters have been employed to denote like elements or features.

DETAILED DESCRIPTION

Figure 3:
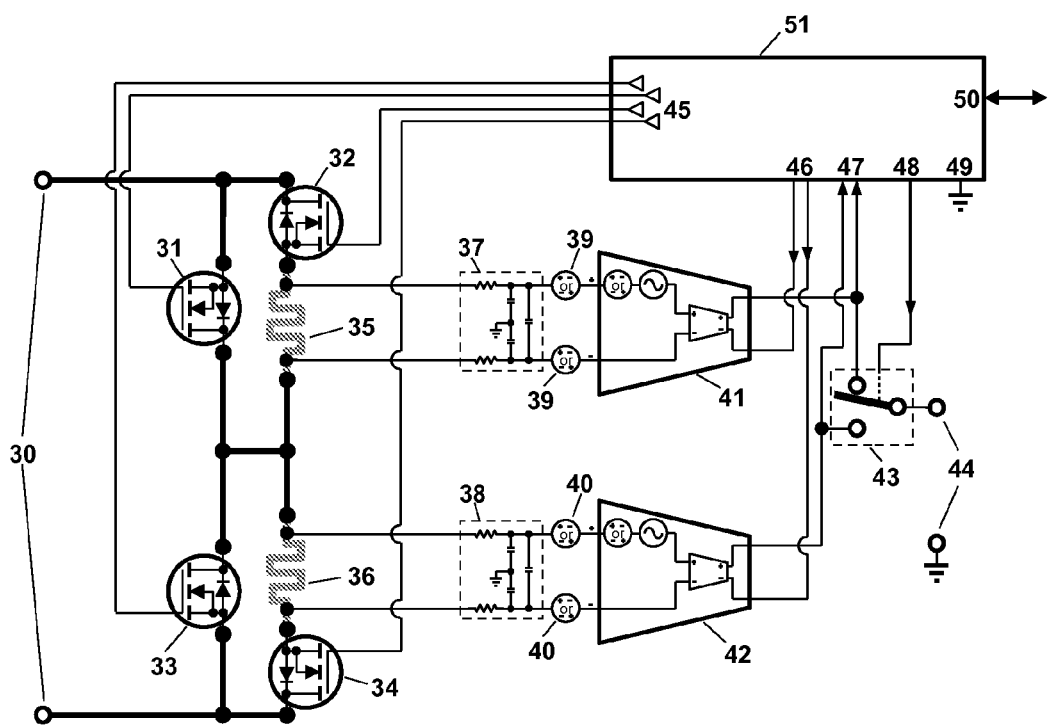
FIG. 3 describes a simple implementation of the current invention.

One embodiment of the invention is shown in FIG. 3. There are two identical current shunts 35 and 36, encircled by power field-effect transistors (FETs) 31-34. Current sense signals pass via RFI filters 37 and 38, and then amplified by IA 41 and 42. An analog selector switch 43 delivers the signal to Output Terminals 44; this signal can be either the output from IA 41, or IA 42. The system presents itself to the outside world at load current terminals 30.

Figure 4:
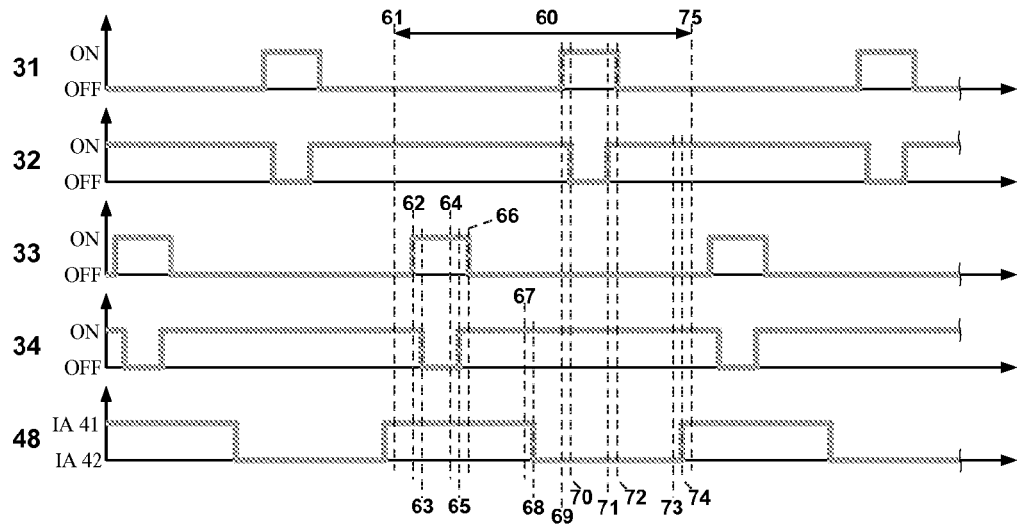
FIG. 4 shows the algorithm for activations of FETs 31-34 and Mux 48 signal in FIG. 3.

Under control of the control circuit 51, and via FET Drivers 45, the FETs 31-34 are turned either fully on or off, as required for the execution of the algorithm detailed in FIG. 4.

The action of FETs 31-34 can direct the current through the current shunts 35, 36, or can disconnect either of shunts 35, 36 by breaking the circuit (by means of FET 32 or 34) and by bypassing the current around each shunt (by means of FET 31 or 33).

As will be discussed below, the system is controlled in such a way that at any moment in time, there is at least a single current shunt that conducts the current, and provides output to the output terminals 44 via IA 41 or 42.

Also, at any point in time, there will be at least a single FET turned on as between FETs 31 and 32. Likewise at any point in time, there will be at least a single FET turned on as between FETs 33 and 34.

Figure 1:
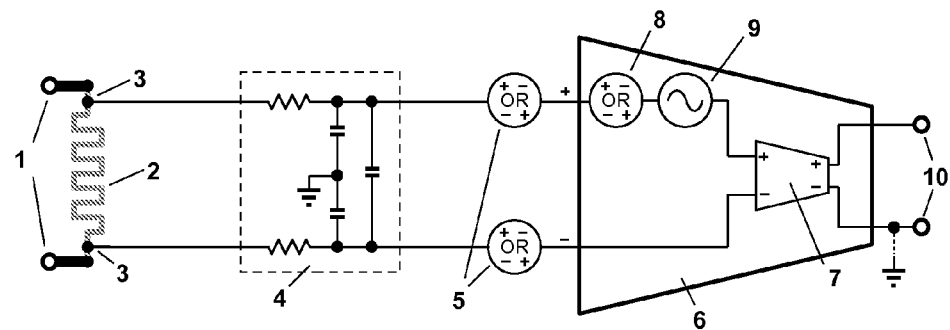
FIG. 1 depicts the prior art circuit.
Figure 2:
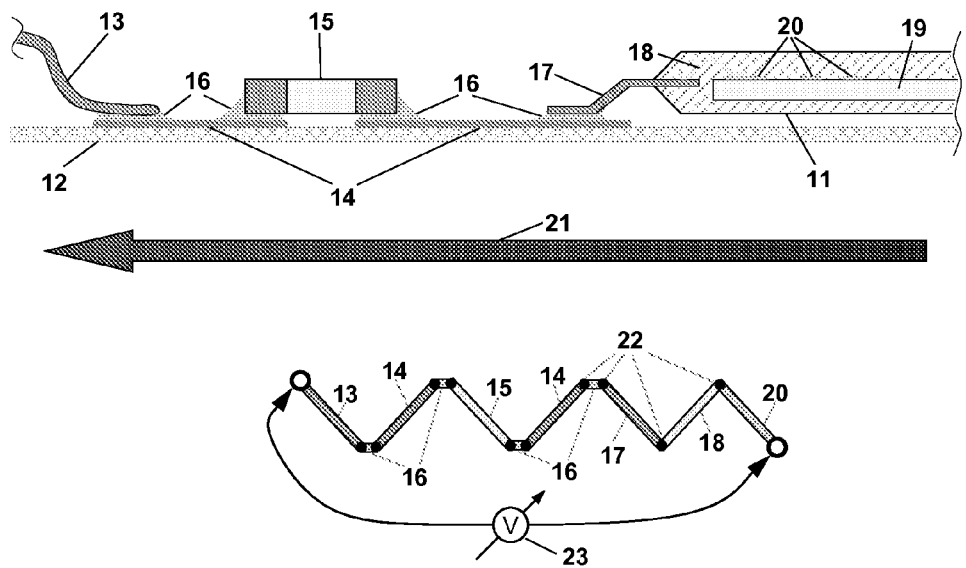
FIG. 2 illustrates generation of voltage errors.

The theory of operation takes into account RFI filters 37, 38 in FIG. 3 serving much the same purpose as the RFI filter 4 in FIG. 1. The theory of operation further models voltage sensing error sources 39, 40 in FIG. 3 that are analogous to the modeled error sources 5 in FIG. 1. Instrumentation amplifiers 41, 42 are modeled as containing respective ideal amplifiers as well as offset and noise error sources just as was discussed in connection with FIG. 1.

As will be discussed, the control circuit 51 has FET drivers 45, and A/D (analog-to-digital) inputs 47. It also has D/A (digital-to-analog) outputs 46, and a multiplexer (mux) control line 48. Operations are carried out relative to a ground reference 49, and a communications interface 50 is depicted, permitting bidirectional digital control and data output. Analog switch 43 (serving as a mux) picks either of two signals and passes it to the above-mentioned output terminals 44.

Current measurement can take place in FIG. 3 much like the current measurement already described in connection with prior-art FIG. 1.

As a first example if FET 32 is closed (conducting) and if FET 31 is open, then the current presented at input terminals 30 passes through shunt 35. Differential sensing path 37, 39, 41 can measure the current through the shunt 35. An analog output can pass through switch 43 to output 44, or the analog output can be converted to digital within controller (for example a microcontroller) 51, and communicated externally through interface 50.

As a second example if FET 34 is closed and if FET 33 is open, then the current presented at input terminals 30 passes through shunt 36. Differential sensing path 38, 40, 42 can measure the current through the shunt 36. An analog output can pass through switch 43 to output 44, or the analog output can be converted to digital within controller (for example a microcontroller) 51, and communicated externally through interface 50.

Importantly, in this system, it is possible to measure the voltage sensing errors and to correct for them, in real time or very nearly in real time. This will now be described.

When it is desired to measure the voltage sensing error, the current is removed from one of the current shunts by: first, activation of the bypass FET (e.g. 31 or 33); and second, de-activation of the corresponding series-connected FET (32 or 34). It will be appreciated that this is preferably carried out in a so-called "make-before-break" method of operations for the pairs of FETs 31, 32 and 33, 34. This is done in order to assure that the external circuit supplied by the current that is being measured in the current sensor circuit does not experience interruptions of current.

When the current to be measured bypasses one of the shunts, the un-energized channel (via IA 41 or IA 42) measures the voltage errors by means of A/D port 47. Control circuit 51 adjusts the output of D/A port 46, until the output of the channel being calibrated is equal to zero. The output at port 46 can be thought of as a correction or zeroing signal that is meant to correct for all or nearly all of the DC error sources.

Later when this channel is placed back into data-gathering service, the data gathered will be free or largely free of the DC error sources that might otherwise have introduced error into the measured current values.

At such a time the other of the two data-gathering channels can be put through this sequence of steps, being taken out of service, having its DC offsets measured and corrected for, and then being placed back into data-gathering service.

In most battery-related applications it is assumed that it is highly desirable to have a continuous analog output such as that shown at terminals 44, for example for use in triggering a "fuse" capability in response to a too-high current. But in the special case where there is no need for a continuous analog output such as it shown at 44, the physical circuit can be simplified and the calibration functions can be simplified. In such a case, the only output from the current sensor circuit will be via the digital communication interface 50. In such a case the analog switch 43 as well as D/A 46 can be omitted. In such a special case, removal of the voltage error can be done entirely in the digital form, by simply subtracting the measured error from the total signal measured by A/D converters 47. This can be done within the control circuit 51 or can be done downstream of interface 50.

The operations described above with respect to switching and bypassing the measured current differ greatly from a typical prior-art approach of reducing the voltage errors. The prior-art approach cannot remove the errors associated with components located between the sense points 3 and the inputs of the amplifier 6 (FIG. 1). Also, the prior-art approach is not able to compensate the errors resulting from lead-to-die bonding 18 inside of the ICs 11, nor can it compensate for residual errors in the current shunt itself.

It is instructive to consider how one goes about selecting the switching elements such as FETs 31, 32, 33, 34. Ordinarily, it would not be prudent to switch the full load current passing through terminals 30, as the voltage rating of the FETs used for such switching would need to be able to withstand the maximum voltage across terminals 30 at times when the switch is open. This would require costly devices for the FETs, namely devices with very high voltage ratings.

In the system described in FIG. 3, however, the maximum voltage across any FET that is "off" (open) is very small, because there is always an "on" FET in parallel with it. (Recall the discussion above about "make-before-break" operation.) Because there is always an "on" FET in parallel with it, the FET is never exposed to more than just some tens of millivolts, and in particular the FET is never exposed to a voltage exceeding about a single diode drop of a forward-conducting diode. For this reason, the transistors used for FETs 31, 32, 33, 34 can be much smaller and less expensive than the units able to withstand the voltage that may be present in the circuit if the current were totally interrupted.

To say this another way, the voltage across the input terminals 30 is always very small. This happy circumstance is in large part why the system of FIG. 3 has a guaranteed very low power dissipation in the sensing current shunts 35, 36 and indeed a very low power dissipation anywhere in the high-current portions of the system.

It will be recognized that the way FETs 31, 32, 33, 34 are connected and driven will guarantee that a voltage that is no more that two diode drops will be present across the input terminals 30 when the whole circuit is not energized, which is when the gate voltages provided by FET drivers 45 are zero (that is, each of the FET switches 31, 32, 33, 34 is in the "off" state). The voltage across the input terminals 30 is limited due to a parasitic diode present in each of the FET devices. Irrespective of the polarity of the current through the input terminals 30 there will always be two series-connected parasitic diodes that will conduct the current.

Two current shunts and two amplification channels are present in order to allow a single channel to provide the continuous readout of the current, while the other channel is being calibrated. Calibration is performed when the current has been diverted away from one of the shunts, and RFI filter 37 or 38 with corresponding IA 41 or 42 have settled to a final value. When that settling has finished, then the auto zeroing action is executed by the control circuit 51. As mentioned above this is carried out by means of an adjustment of the D/A to null-out the output of the appropriate IA 41 or 42. Once calibration is finished, the inactive channel is switched back into service, by allowing the current to flow once again through the current shunt as to that channel. After RFI filter 37 or 38 has settled to a new value that is representative of the current being measured, the analog switch 43 is used to switch the output terminals 44 to this newly calibrated channel. Thus, there are times in this circuit when each of the two channels has an output representative of the current being measured. During such times, the control circuit 51 can cross-correlate the two signals, total accuracy of the current sensor can be improved by averaging the two values, and problems with the circuit can be discovered and reported if the readings from two shunts start to diverge. This permits early annunciation of a possible later failure, and permits preventative maintenance such as replacement of the current sensing system.

The circuit's operating algorithm will now be described referring to FIG. 4.

An arbitrarily selected point in time 61 is chosen as the beginning of the algorithmic cycle 60. At this time both shunts 35 and 36 have the current flowing through (due to activation of FETs 32 and 34) and both channels are providing the current signal; however mux 48 signal has just selected the output of IA 41 to be passed to output terminals 44.

At point 62 the bypass FET 33 is turned on.

Some time later at point 63 the series FET 34 for Shunt 36 is switched off; during the time interval between 62 and 63 both FETs 32 and 34 are on; this action provides the previously mentioned "make-before-break" action.

At point 63 the current in shunt 36 is stopped, and the voltage across that shunt should be exactly zero; however, due to error sources described above, the voltage at the input terminals of IA 42, after passage through the sense connections and RFI filter 38, may contain some nonzero systematic offset error. At point 63 the RFI filter 38 starts to settle toward the final stable value.

At point 64 the RFI filter 38 has finished settling and provides a stable value to the IA 42; the output voltage of IA 42 is sampled by one of the channels of A/D 47. One of the D/A 46 outputs is adjusted upward or downward as needed until the output from IA 42 is equal to zero.

At points 65 and 66 the current flow is returned to shunt 36, following the "make-before-break" scheme described above.

At point 67 the RFI filter 38 has fully settled to the value representative of the current flowing in Shunt 36.

Finally at 68 the output is switched to the newly calibrated channel by changing the state of signal Mux 48; now the output terminals 44 are connected to the output of IA 42.

Note that for the duration of the calibration activity for the measurement channel related to shunt 36, the channel related to Shunt 35 has been supplying the output signal.

At points 69 through 74 exactly the same procedure as described above, from point 62 to point 68, is applied to the measurement channel related to Shunt 35 mutatis mutandis, with actions applied to FETs 31, 32 and mux 48.

The descriptions for points 69 through 74 are analogous to those just given.

Finally, a new algorithmic cycle starts at point 75.

It will be appreciated that at the very beginning of the operations (when the power is first applied to the whole circuit), a slightly different cadence could be utilized in order to acquire the initial values of the offset errors; then the complete cycle 60 repeats indefinitely. However the duration of the complete calibrate/measure/settle/switchover cycle 60 can be adjusted, depending on the rate of change of the temperature and/or temperature gradients over the circuit.

The current shunts 35, 36 may be expected to have some dependence of resistance upon temperature, depending on the material used for the shunts. For example in an exemplary embodiment, the current shunts could be created with a copper pattern on a PCB (and thus avoid the necessity to procure and assemble separate discrete components). In this case the temperature dependency of the copper used for the conductive tracks on the PCB would be well known and predictable, and the resistance value changes could be readily compensated by digital calculations in the control circuit 51 or in calculations performed downstream of interface 50. To this end it is desirable that the ambient temperature at the current sensing system be sensed with a suitable temperature sensor or sensors; this part of the circuits is familiar and is omitted for clarity from the figures.

In a typical application of the system of FIG. 3, the two outputs (at interface 50 and at terminals 44) have very different purposes. The coulometry or other state-of-charge calculations are carried out using the information at interface 50 (which is temperature-corrected using the temperature sensing just mentioned) while the "fuse" function is carried out based upon the signal at terminals 44. For the purposes of the "fuse" function there is probably no need to make the fine temperature-compensation corrections just described.

Saying this in different words, if required, the continuous analog output at output terminals 44 could also be adjusted to compensate for the current shunts' resistance changes. It is expected, however, that the main application of the continuous analog output is to provide the fast electronic solid state fuse capability which may not require very high precision, and may well be served sufficiently with a value that has not been compensated for resistance changes in the current shunts. Nevertheless, if it is desired to provide temperature compensation at the continuous analog output, this could be done by means of programmable gain functionality in IA 41 or 42, for example by means of third and fourth D/A outputs from microcontroller 51.

It is perhaps helpful at this point to review some of the benefits that are provided by the system of FIG. 3.

This system provides a current sensor that is accurate at much larger range of measured currents than circuits of the prior art. The system indeed provides several-orders-of-magnitude dynamic range improvement. Compared with the prior-art implementations, the current invention reduces the waste of energy in the sensing element to near zero. The energy consumption of the circuit itself can be reduced to near zero levels under conditions of low reporting rates for the measured current and/or accumulated charge. Due to very low measurement offset for the DC current, a measurement of accumulated charge is quite accurate, even under conditions of a load current that is much of the time many times smaller than the maximum rated load current.

The high accuracy of the current sensor is enhanced due to continuous assessment of the interfering voltage errors, and due to subtracting of these errors from the actual measured value. Such subtracting may be carried out in analog hardware or in software.

The output of the circuit according to the current invention is continuous, if such an operating mode is desired; this is in spite of the fact that each data path in the sensor alternates between the actual measurement and the calibration functionality (in order to measure and zero-out the errors).

The ability to provide a continuous output is important (and is available) if fast-acting electronic fuse functionality is desired.

The actual frequency with which the calibration cycles are performed can be fixed or it can depend on the changes in the temperature or temperature gradients that are the dominant causes of the errors. In other words, the calibration cycles can be performed more frequently if the temperatures and/or temperature gradients change rapidly.

In an exemplary embodiment, the "on" resistance of FETs 31, 32, 33, 34 is much smaller than the resistance of shunts 35 and 36. However, such an exemplary result may not be practical from the cost point of view, if it were to turn out that FETs 31, 32, 33, 34 with such low resistance would be prohibitively expensive. However, the circuit operations and algorithm do not change even if FETs with "on" resistance comparable or even higher than the resistance of the shunts is utilized. This situation will typically arise when measuring very high currents. Even if the affordable FETs were to have "on" resistance higher than that of the shunts, it would still be the case that the system of FIG. 3 offers many benefits as compared with the system of FIG. 1.

In this case, by the addition of two extra (redundant) current shunts 35a and 36a, and two additional channels of filtering and amplification, the circuit can be made more accurate (by averaging of four instead of two values), more reliable, and able to operate even when one or more of the current shunts becomes defective and/or change resistance unpredictably. This is disclosed in FIG. 5.

Again assuming for sake of discussion that the FETs that are chosen are inexpensive and have an "on" resistance higher than the resistance of the shunts, then as the "on" resistance of FETs 31, 32, 33, 34 dominates the total resistance value between input terminals 30, the additional current shunts 35a and 36a do not appreciably change the total resistance, and do not substantially change the total heat loss.

Figure 5:
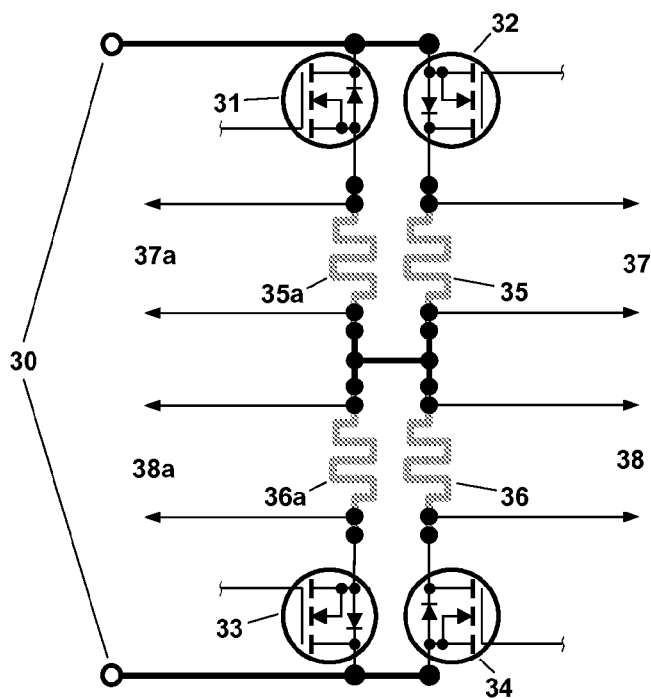
FIG. 5 presents an alternative embodiment with redundant current shunts, and FIG. 6 demonstrates an alternative embodiment with two RFI filters in each channel.

For an exemplary embodiment according to FIG. 5, the operating algorithm can be modified, specifically the time when current is flowing through Shunts 35, 35a, 36, and 36a should be made equal, in order to equalize the heat dissipation in the individual current shunts, and this will tend to make their temperatures the same. This may be termed "'on' time equalization". Such equalization will aid in maintaining accuracy of the measurements. However, if the period of the algorithmic cycle 60 is longer than the thermal time constant of the current shunts and surrounding circuitry (including FETs 31, 32, 33, 34), then the "on" time equalization may not be useful or necessary and may not be required.

The assumption in the system of FIG. 3 is that the RFI filters 37, 38 are designed to have some settling time, and the measurement procedures carried out provide a sufficient and arbitrarily long time for settling of the RFI filters 37 and 38. The measurement procedures are able to accommodate filters 37, 38 with extremely long time constants. This is beneficial for the accuracy of the measurements when output of the current sensor is used for accumulation of the total charge passed through the input terminals 30 (e.g. coulometry). If such an integrated current value is maintained and calculated in the digital part of the circuit, an increase in the time constant of the RFI filter can be taken advantage of for lowering of the required sampling rate of the A/D converters 47 (FIG. 3).

Figure 6:
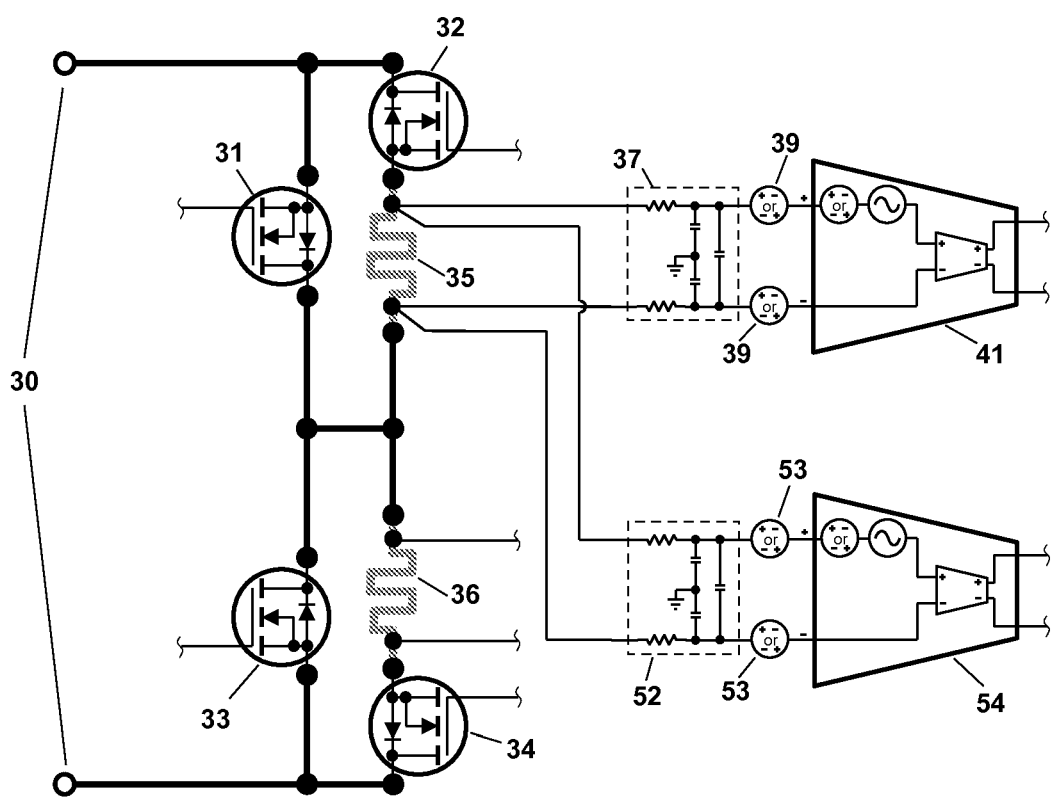

However, in this case, the fast response time of the (analog) output 44, used for solid-state fuse functionality, will be compromised. FIG. 6 shows a way to address this situation. As may be seen in this figure, one channel of measurements associated with shunt 35 becomes two data paths, first data path having RFI filter 37 and IA 41, and second data path having RFI filter 52 and IA 54. The other data paths for shunt 36 are omitted for clarity in FIG. 6 but are analogous.

The output of the IA 41 is connected to the output terminals 44 via Switch 43 (as shown in FIG. 3); in this arrangement RFI filter 37 is selected to have a (relatively short) time constant that is appropriate for the solid-state fuse functionality. On the other hand, the output of the IA 54 is only connected to the additional A/D input of controller 51, and is not connected to the switch 43, the value on the output of IA 54 will only be reported in digital form after processing in the Control Circuit 51, and it does not require the offset-compensation D/A (as the calibration value would be subtracted digitally). In this arrangement the RFI filter 52 has a (relatively long) time constant that is suitable for the measurements of the charge passing through the current shunt, while utilizing a slow sampling rate of the A/D. RFI filter 52 has a time constant that is (in this exemplary embodiment of FIG. 6) many times longer than the time constant of RFI filter 37. The timing of the operating algorithm is thus set to properly service the timing requirements of the RFI filter 52 (since RFI filter 37 has a shorter time constant, its settling time requirements will certainly be satisfied).

As mentioned above, similar circuitry is provided for shunt 36, with two corresponding RFI filters and two corresponding IA. An IA that is associated with a fast RFI filter is connected to Output Terminals 44 via Switch 43, while the output of other IA is connected only to an additional A/D input, as depicted here for shunt 35.

Accordingly, the invention disclosed in FIG. 6 can be used simultaneously for fast electronic solid-state fuse functionality via continuous analog output, and for precise measurements of the accumulated charge that is reported digitally by control circuit 51, each functionality carried out with an RFI filter that is optimized for that functionality.

The alert reader will ask whether this same slow-fast functionality (fast for the fuse, slower for the highly accurate coulometry) can be achieved by a single (fast) RFI filter, followed by an IA, and then followed by another filter that is suitable for reduction of the A/D sampling rate, as is typical of the prior art. In response it may be observed that in this case the fast transients of the measured current have to be faithfully reproduced and amplified by the IA before the bandwidth of the signal can be reduced by the second (slow) filter. Any nonlinearity in the Instrumentation Amplifier, especially when combined with the quickly changing signal (that may create clipping and generally disturb linear operations of IA), will have a profound effect on the accuracy of the measurements for purposes of the desired highly accurate coulometry. Utilizing a method specifically different from the prior art, the present invention firstly limits the bandwidth with a "slow" filter 52 (utilizing passive components for the filter 52 that are naturally highly linear in the presence of transients); then the output of the "slow" filter is amplified by IA 54 (that can thus be a low-bandwidth unit, with corresponding very low power consumption).

In addition to coulometry, it is possible to accumulate the measured current data, either in control circuit 51 or downstream of the communication channel 50, with the ultimate purpose of discovering the shape of the measured current. With further digital processing, either in control circuit 51 or downstream of the communication channel 50, the frequency spectrum components can also be revealed. This will have applications, for example, in determining the complex impedance value of the load that is supplied with the current being monitored and measured by the devices built according to the invention. This will also have applications, for example, in determining the complex impedance value of the energy source (here, typically a battery) that is providing the current being monitored and measured by the devices built according to the invention. Such determination may be carried out in connection with an accurate measurement of the voltage across the load or the voltage across the battery as the case may be.

It will be recognized that the control circuit 51 will be best served by the use of a microprocessor or microcontroller; the whole circuit 51 can in fact be contained in a single-chip microcontroller that also includes the required functionality of A/D 47, D/A 46, communication interface 50, and port pins that will serve as mux signal 48 and FET drivers 45. Instrumentation Amplifiers can reside on the same chip for a compact and inexpensive solution.

The invention has been described above with respect to particular embodiments, but of course the invention should not be construed as being limited to these specific embodiments. As but one example the shunts are described as (for example) copper traces on a circuit board, and yet any of a number of other shunt types could be employed instead without departing from the invention. Each switching device is shown as (for example) a single FET, and yet other switching devices might be employed instead without departing from the invention.

It will be appreciated that the alert and thoughtful reader may readily devise myriad obvious variations and improvements upon the invention, without departing from the invention at all. Any and all variations and improvements are intended to be encompassed within the claims which follow.

The invention claimed is:

1. A system for measuring current passing through distinct first and second input terminals, the system comprising:
a first switch and a first shunt in series, connected between the first input terminal and a node;
a second switch and a second shunt in series, connected between the node and the second input terminal;
a third switch connected between the first input terminal and the node, the third switch thereby in parallel with the first switch and the first shunt in series;
a fourth switch connected between the node and the second input terminal, the fourth switch thereby in parallel with the second switch and the second shunt in series;
a first data path measuring voltage across the first shunt and providing a first output;
a second data path measuring voltage across the second shunt and providing a second output; and
a control means selecting one or the other of the first and second outputs, communicating information indicative of the selected output external to the system.

2. The system of claim 1 wherein the control means closes from time to time the third switch and opens the first switch, at a time when the second switch is closed and the fourth switch is open, and then to measure the first output, thereby deriving first correction information, and the control means closes from time to time the fourth switch and opens the second switch, at a time when the first switch is closed and the third switch is open, and then to measure the second output, thereby deriving second correction information; and the control means is disposed to make use of the first correction information to correct the first output, and the control means is disposed to make use of the second correction information to correct the second output.

3. The system of claim 2 wherein the manner in which the control means makes use of the first correction information is to subtract it digitally from the first output, and wherein the manner in which the control means makes use of the second correction information is to subtract it digitally from the second output, downstream of which the information indicative of the selected output is communicated external to the system by means of a digital interface.

4. The system of claim 2 wherein the manner in which the control means makes use of the first correction information is to apply the first correction information as an analog input to a first analog amplifier in the first data path, and wherein the manner in which the control means makes use of the second correction information is to apply the second correction information as an analog input to a second analog amplifier in the second data path.

5. The system of claim 4 wherein downstream from the application of the correction information, the information indicative of the selected output is communicated external to the system by means of a digital interface.

6. The system of claim 4 wherein downstream from the application of the correction information, an analog switch selects one of the first and second outputs, and connects the selected output external to the system by means of an analog signal.

7. The system of claim 6 wherein the control means controls the analog switch.

8. The system of claim 1 further comprising:
a third shunt in series with the third switch, whereby the third shunt and third switch are connected between the first input terminal and the node;
a fourth shunt in series with the fourth switch, whereby the fourth shunt and fourth switch are connected between the node and the second input terminal;
a third data path measuring voltage across the third shunt and providing a third output; and
a fourth data path measuring voltage across the fourth shunt and providing a fourth output;
the control means receiving the first, second, third, and fourth outputs and communicating information indicative of one or more of the outputs external to the system.

9. The system of claim 8 wherein the control means averages the first, second, third, and fourth outputs and communicates information indicative of the average external to the system.

10. The system of claim 8 wherein the control means compares the first, second, third, and fourth outputs and communicates information indicative of potential failure thereof external to the system.

11. The system of claim 1 wherein the control means controls the first and third switches in a make-before-break fashion, and controls the second and fourth switches in a make-before-break fashion.

12. The system of claim 1 wherein an analog switch receives the first and second outputs, connecting at all times to one or the other of the first and second outputs, the analog switch having an output usable for a fast-acting solid-state fuse.

13. The system of claim 12 wherein the control means controls the analog switch.

14. The system of claim 1 wherein there is provided within each of the first and second data paths a respective radio-frequency interference filter, and downstream thereof a respective instrumentation amplifier.

15. The system of claim 1 further comprising:
a third data path measuring voltage across the first shunt and providing a third output; and
a fourth data path measuring voltage across the second shunt and providing a fourth output;
the first and third data paths each having a respective non-identical radio-frequency filter, and downstream thereof a respective instrumentation amplifier;
the second and fourth data paths each having a respective non-identical radio-frequency filter, and downstream thereof a respective instrumentation amplifier; and
an analog switch receiving the first and second outputs, connecting at all times to one or the other of the first and second outputs, the analog switch having an output usable for a fast-acting solid-state fuse;
the control means further characterized in that it selects one or the other of the third and fourth outputs, communicating information indicative of the selected output external to the system.

16. The system of claim 15 wherein the respective radio-frequency filters of the third and fourth data paths each have a slower settling time than the respective radio-frequency filters of the first and second data paths.

17. The system of claim 1 further comprising computational means receiving as input the selected output and providing as an output a computed value for complex impedance of a battery connected to one of the first and second input terminals.

18. The system of claim 17 wherein the computational means performs a real-time Fourier transform upon the selected output.

19. A method for measuring current passing through distinct first and second input terminals, the method comprising the steps of:

providing a first switch and a first shunt in series, connected between the first input terminal and a node;

providing a second switch and a second shunt in series, connected between the node and the second input terminal;

providing a third switch between the first input terminal and the node, the third switch thereby in parallel with the first switch and the first shunt in series;

providing a fourth switch between the node and the second input terminal, the fourth switch thereby in parallel with the second switch and the second shunt in series;

closing the third switch and opening the first switch, at a time when the second switch is closed and the fourth switch is open, and measuring the first output, thereby deriving first correction information;

making use of the first correction information to correct the first output;

closing the fourth switch and opening the second switch, at a time when the first switch is closed and the third switch is open, and measuring the second output, thereby deriving second correction information; and making use of the second correction information to correct the second output.

20. The method of claim 19 wherein:
the step of closing the third switch and opening the first switch further comprises selecting the second output and communicating information indicative of the second output external to the system; and
wherein
the step of closing the fourth switch and opening the second switch further comprises selecting the first output and communicating information indicative of the first output external to the system.

21. The method of claim 20 wherein:
the step of making use of the first correction information comprises subtracting it digitally from the first output, and wherein
the step of making use of the second correction information comprises subtracting it digitally from the second output, and wherein
the step of communicating the information indicative of the selected output is carried out by means of a digital interface.

22. The method of claim 20 wherein:
the step of communicating information indicative of the selected output is carried out by means of a digital interface.

23. The method of claim 20 wherein:
the step of selecting the first output or the second output comprises controlling an analog switch to select one of the first and second outputs, and wherein
the step of communicating information indicative of the selected output is performed by communicating an analog signal.

24. The method of claim 19 wherein:
the step of making use of the first correction information comprises applying the first correction information as an analog input to a first analog amplifier in the first data path, and wherein
the step of making use of the second correction information comprises applying the second correction information as an analog input to a second analog amplifier in the second data path.

25. The method of claim 19 further comprising:
providing a third shunt in series with the third switch, whereby the third shunt and third switch are connected between the first input terminal and the node;
providing a fourth shunt in series with the fourth switch, whereby the fourth shunt and fourth switch are connected between the node and the second input terminal;
providing a third data path measuring voltage across the third shunt and providing a third output;
providing a fourth data path measuring voltage across the fourth shunt and providing a fourth output; and
communicating information indicative of one or more of the outputs external to the system.

26. The method of claim 25 wherein the first, second, third, and fourth outputs are averaged and information indicative of the average is communicated external to the system.

27. The method of claim 25 wherein the first, second, third, and fourth outputs are compared and information indicative of potential failure thereof is communicated external to the system.

28. The method of claim 19 wherein the first and third switches are operated in a make-before-break fashion, and the second and fourth switches are operated in a make-before-break fashion.

29. The method of claim 19 wherein an analog switch receives the first and second outputs, and connects at all times to one or the other of the first and second outputs.

30. The method of claim 19 further comprising the steps of:
providing a third data path measuring voltage across the first shunt and providing a third output; and
providing a fourth data path measuring voltage across the second shunt and providing a fourth output;
providing in each of the first and third data paths a respective non-identical radio-frequency filter, and
downstream thereof a respective instrumentation amplifier;
providing in each of second and fourth data paths a respective non-identical radio-frequency filter, and
downstream thereof a respective instrumentation amplifier; and
connecting at all times one or the other of the first and second outputs to an output usable for a fast-acting solid-state fuse;
selecting at all times one or the other of the third and fourth outputs, and communicating information indicative of the selected output external to the system.

31. The method of claim 19 further comprising the steps of:
computing a computed value for complex impedance of a battery connected to one of the first and second input terminals, based in part upon the first output and the second output.

32. The method of claim 31 wherein the computing step comprises performing a real-time Fourier transform upon the first output and the second output.

* * * * *